(12) United States Patent
Yang

(10) Patent No.: US 7,358,145 B2
(45) Date of Patent: Apr. 15, 2008

(54) METHOD OF FABRICATING SHALLOW TRENCH ISOLATION STRUCTURE

(75) Inventor: Chin-Cheng Yang, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 105 days.

(21) Appl. No.: 11/455,130

(22) Filed: Jun. 15, 2006

(65) Prior Publication Data
US 2007/0293017 A1    Dec. 20, 2007

(51) Int. Cl.
*H01L 21/20* (2006.01)
(52) U.S. Cl. .............................. 438/391; 257/E21.545
(58) Field of Classification Search .......... 257/E21.54, 257/E21.545; 438/196, 207, 218, 219, 221, 438/248, 295, 296, 297, 359, 391
See application file for complete search history.

(56) References Cited

U.S. PATENT DOCUMENTS

| 5,719,085 | A  | * | 2/1998 | Moon et al. | 438/424 |
|---|---|---|---|---|---|
| 5,940,717 | A  | * | 8/1999 | Rengarajan et al. | 438/435 |
| 6,180,493 | B1 | * | 1/2001 | Chu | 438/437 |
| 7,033,945 | B2 | * | 4/2006 | Byun et al. | 438/700 |
| 2003/0045057 | A1 | * | 3/2003 | Tseng | 438/259 |
| 2003/0199151 | A1 | * | 10/2003 | Ho et al. | 438/437 |
| 2005/0009290 | A1 | * | 1/2005 | Yan et al. | 438/424 |
| 2005/0277257 | A1 | * | 12/2005 | Byun et al. | 438/296 |
| 2007/0087565 | A1 | * | 4/2007 | Culmsee et al. | 438/675 |
| 2007/0205489 | A1 | * | 9/2007 | Tilke et al. | 257/618 |

\* cited by examiner

*Primary Examiner*—Thao P. Le
(74) *Attorney, Agent, or Firm*—J.C. Patents

(57) ABSTRACT

A method of fabricating a shallow trench isolation structure is provided. A substrate is provided with a pad layer, a mask layer and a shallow trench formed therein. A liner oxide layer is formed on the sidewall of the shallow trench and then a silicon nitride layer is formed conformably over the substrate. A developable material layer is formed to fill up the shallow trench. After the baking process, a part of the developable material layer is removed until the top surface of the developable material layer is lower than that of the substrate. The silicon nitride layer that is exposed by the developable material layer is removed and the remained developable material layer is removed. Following a thermal oxidation process, an insulating layer is formed over the substrate and fills up the shallow trench. After planarization and removing the mask layer, a shallow trench isolation structure is formed.

17 Claims, 5 Drawing Sheets

METHOD OF FABRICATING SHALLOW TRENCH ISOLATION STRUCTURE

BACKGROUND OF THE INVENTION

1. Field of Invention

The present invention generally relates to a method of fabricating an isolation structure. More particularly, the present invention generally relates to a method of fabricating a shallow trench isolation structure.

2. Description of Related Art

Following the advances in semiconductor technologies, the sizes of the semiconductor devices decrease down to the range of deep sub-microns. Isolation structures are now of great importance for isolating individual devices in high integration integrated circuits and inferior isolation structures may cause shorts between adjacent devices. At present, the most common isolation technology employs the shallow trench isolation (STI) structures.

FIG. 1 is a cross-sectional view for the process step of the typical STI process. Referring to FIG. 1, a substrate 100 with a patterned pad layer 102 and a patterned mask layer 104 formed thereon, and a shallow trench 110 formed therein, is provided. A liner oxide layer 120 is formed on the surface of the substrate within the shallow trench 110. After forming the liner oxide layer 120, an insulating oxide layer (not shown) is filled into the trench 110 and is densified. During the densification process, the high temperature may cause the liner oxide layer 120 to exert inconsistent compressive stress to the substrate 100, leading to dislocations occurring at corners of the substrate 100 under the trench 110.

Further, a silicon nitride layer 130 may be formed over the substrate 100 along the shallow trench 110, and the tensile stress generated by the silicon nitride layer 130 may compensate the compressive stress from the liner oxide layer 120 for relieving the dislocation.

However, top corners 135 of the shallow trench 110 often have corner thinning issues; that is, the liner oxide layer 120 at the top corners 135 is thinner than the other portions, which tends to cause the current leakage problem or the so-called kink effects.

For solving the above issues, photolithography and etching are performed to remove a portion of the silicon nitride layer 130 around the top corners of the shallow trench 110 using the patterned photoresist layer 140 as a mask. However, due to misalignment during the photolithography and etching process, the patterned photoresist layer 140 may cover too much or too less of the silicon nitride layer 130, as shown in FIG. 1, and the issue of corner thinning still remains.

SUMMARY OF THE INVENTION

It is therefore an object of the invention to a method of fabricating a shallow trench isolation structure, fortifying the top corners of the shallow trench isolation structure. Therefore, problems of dislocations or current leakage can be alleviated.

It is therefore an object of the invention to provide a method of fabricating a shallow trench isolation structure, by using a developable material layer to save one photolithography process.

To achieve these objects and advantages, and in accordance with the purpose of the invention, as embodied and broadly described herein, the invention is directed towards a method of fabricating a shallow trench isolation structure. On a substrate, a patterned pad oxide layer and a patterned mask layer are formed and the substrate is patterned to form a trench. A liner layer is formed on the exposed surface of the substrate in the trench. A silicon nitride layer is formed conformally over the substrate, covering the liner layer and the patterned mask layer. A developable material layer is formed over the substrate to fill the trench. Etching back or wet etching is performed to remove a portion of the developable material layer until the top surface of the remained developable material layer is lower than that of the substrate. The silicon nitride layer that is exposed by the remained developable material layer is removed to expose a portion of the substrate. The developable material layer is removed. An insulating layer is deposited over the trench and the substrate and fills the trench. A planarization process is performed until the patterned mask layer is exposed. The remained mask layer is removed to complete the shallow trench isolation structure.

According to the preferred embodiment, a material of the developable material layer may include a negative photoresist material or a developable bottom anti-reflective coating (d-BARC) material. A developing solution can be used for the etching back step or the wet etching process to remove a portion of the developable material layer.

According to the preferred embodiment, the silicon nitride layer is partially removed to expose the top corners or the periphery of the trench and a thermal process is performed to round the corners for forming a sufficiently thick oxide layer. Therefore, the problem of corner thinning can be alleviated. Moreover, by using the developable material layer to cover the silicon nitride layer to be preserved, the exposed silicon nitride layer around the corners of the trench is removed in a self-aligned way, thus avoiding the prior misalignment issues by using the photolithography process.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

FIGS. 2A to 2G are cross-sectional views showing the process steps of fabricating a STI structure in accordance with a preferred embodiment of the invention.

Figure 1:
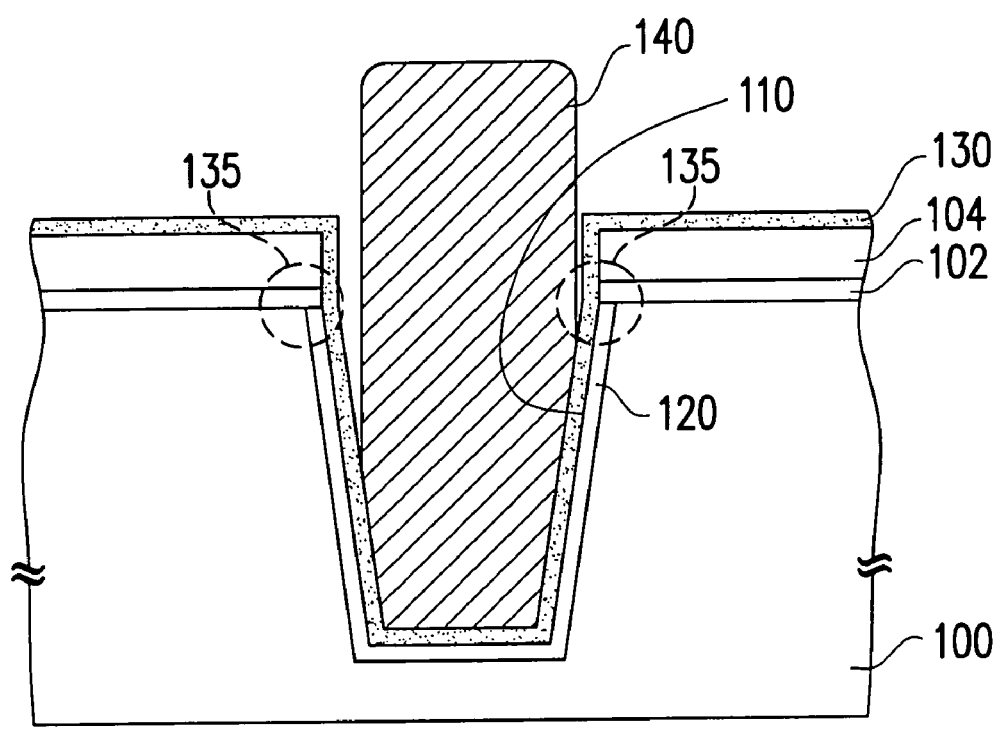
FIG. 1 is a cross-sectional view showing the conventional process step for fabricating a STI structure.
Figure 2A:
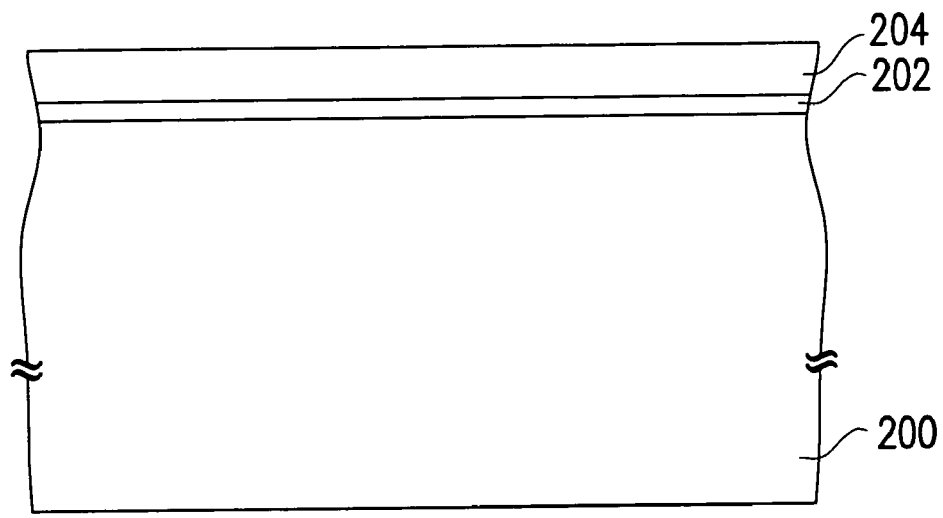
FIGS. 2A to 2G are cross-sectional views showing the process steps of fabricating a STI structure in accordance with a preferred embodiment of the invention.

Referring to FIG. 2A, on a provided semiconductor substrate 200, for example, a silicon substrate, a pad 202 layer and a mask layer 204 are sequentially formed. The material of the pad layer 202 is, for example, silicon oxide formed by thermal oxidation. The material of the mask layer is, for example, silicon nitride, silicon oxynitride or other suitable materials.

Figure 2B:
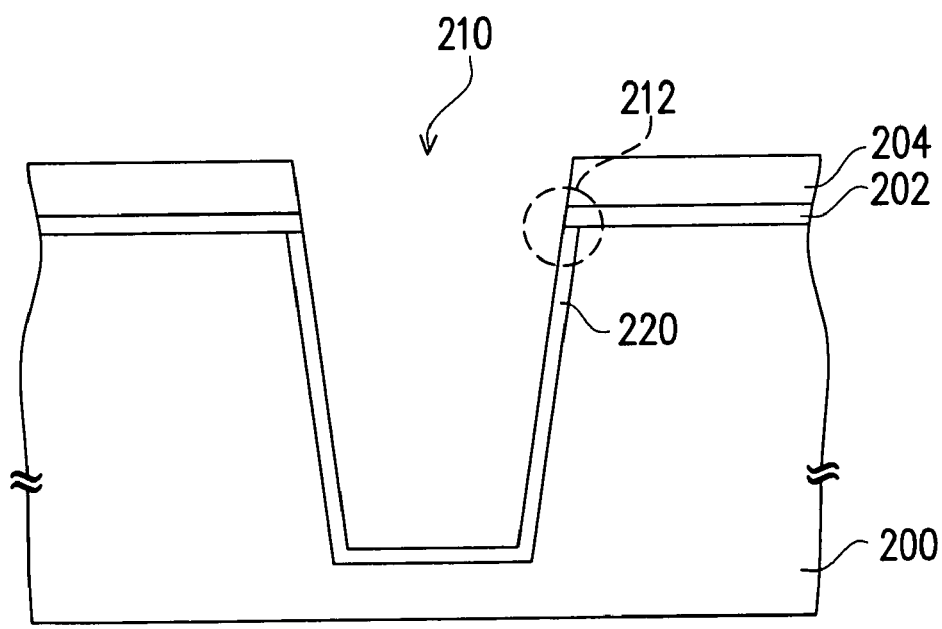

Referring to FIG. 2B, the pad layer 202 and the mask layer 204 are patterned by conventional techniques of photolithography and etching, for example. Using the patterned silicon nitride layer 204 as a mask, at least a shallow trench 210 is formed in the substrate 200 after removing a portion of the substrate 200.

Referring again to FIG. 2B, a liner layer 220 is formed on a surface of the shallow trench 210 by, for example, rapid thermal oxidation. The liner layer 220 may be formed only on the exposed substrate surface in the shallow trench 210. Preferably, the liner layer is a silicon oxide liner layer. After the formation of the liner layer 220, a densification process may be performed. During the fabrication process, compressive stress generated by the liner layer 220 may result in dislocation in the substrate, and the liner layer 220 at the top corners 212 of the trench 210 may be thinner. These issues will be addressed in the following process steps.

Figure 2C:
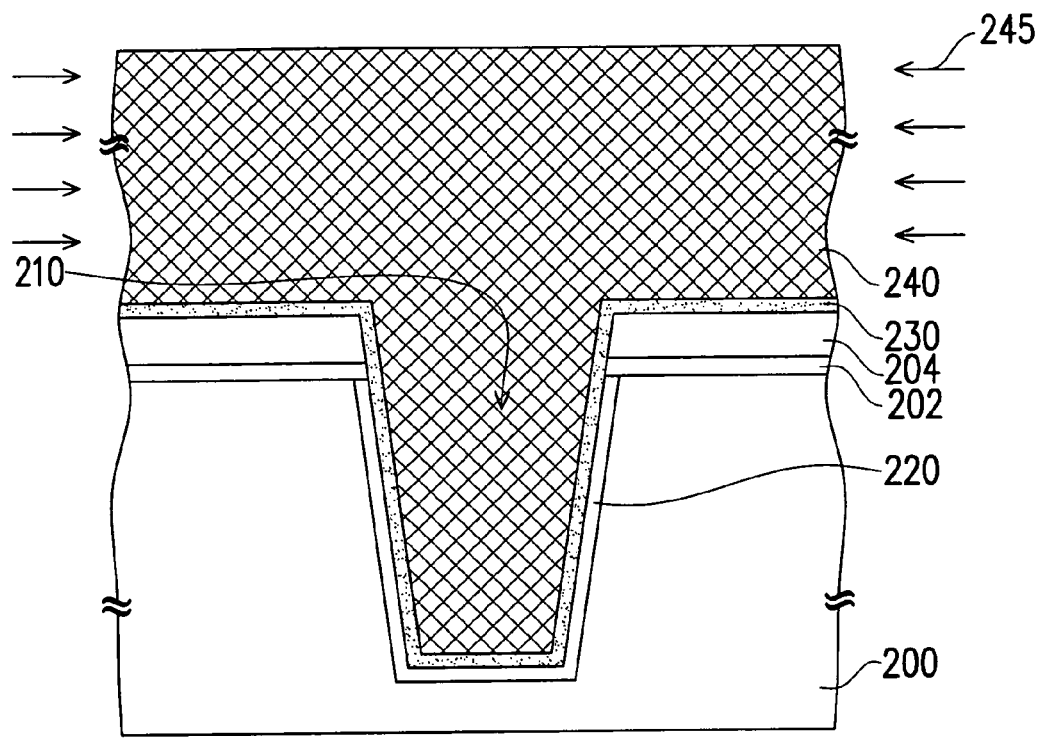

Referring to FIG. 2C, a silicon nitride layer 230 is conformally formed over the substrate 200, covering the liner layer 220 and the patterned mask layer 204. The silicon nitride layer can provide tensile stress for counter-balancing the compressive stress generated by the liner layer 220, thus relieving the dislocation problem.

In FIG. 2C, a developable material layer 240 is formed on the silicon nitride layer 230 and fills up the trench 210. The material of the developable material layer 240 can be a polymer material that is removable by the development process, such as, a negative photoresist material or a developable bottom anti-reflective coating (d-BARC).

The developable material layer 240 has to fill up the trench 210. In order to protect the devices in the loose pattern region during the subsequent removal of the developable material layer 240 in both the loose and dense pattern regions, the thickness of the developable material layer 240 needs to be at lest 5-10 times of the depth of the shallow trench 210. Preferably, the thickness of the trench 210 is between 1500-3000 Angstroms, while the thickness of the developable material layer 240 is between 7500-30000 Angstroms, for example.

Referring again to FIG. 2C, a baking process 245 is performed. The baking process 245 is, for example, a soft baking process with a temperature between 120-240° C. The baking process 245 may strengthen the adhesion between the developable material layer 240 and the silicon nitride layer 230. Either the temperature or the reaction time of the baking process 245 can affect the removal rate of the developable material layer 240. For example, as the temperature of the baking process 245 is higher or the baking time is longer, the cross-link degree of the developable material layer 240 may be better and the removal rate of the developable material layer 240 may be slower.

Figure 2D:
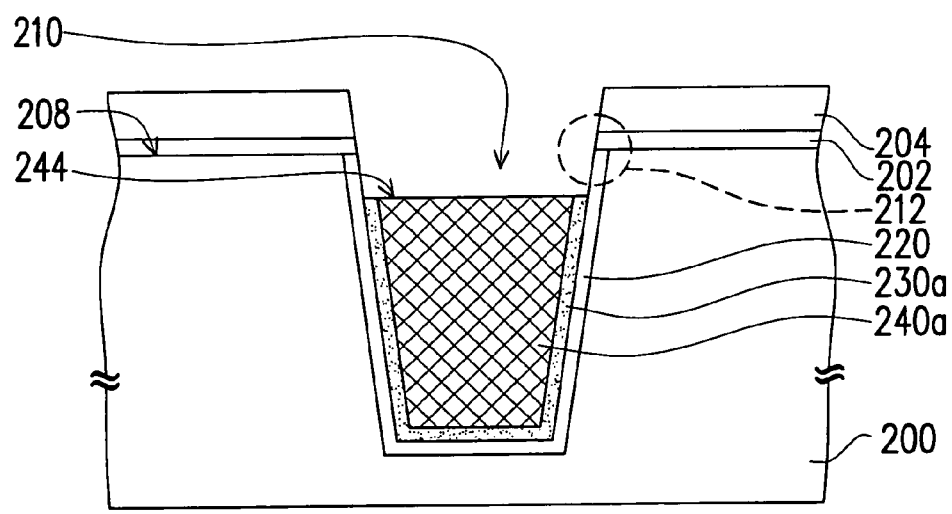

Referring to FIG. 2D, a portion of the developable material layer 240 is removed until at least the top surface 244 of the developable material layer 240 is lower than the top surface 208 of the substrate 200, by etching back or wet etching, for example. Therefore, a portion of the silicon nitride layer 230 around the top corners of the trench 210 is exposed. Preferably, the etching back process is performed in a development tool using a developing solution, and the developing solution reacts with the developable material layer 240 to remove a portion of the developable material layer 240. For example, the developing solution is a solution of tetra-methylammonium hydride (TMAH) in a concentration of 2.38% or less. The removal rate or the removal amount of the developable material layer 240 can be controlled by the concentration of the developing solution. Higher concentrations of the developing solution result in faster removal rate of the developable material layer 240.

In one embodiment, a hard baking process may be further performed after the step of removing a portion of the developable material layer 240, for reducing the solvent content remained in the developable material layer 240.

By using the developable material layer 240, the method of this invention can precisely control to expose the portion of the silicon nitride layer 230 to be removed and to cover the portion of the silicon nitride layer 230 to be preserved in the subsequent process. The prior misalignment problem due to the photolithography and etching process can be avoided. Furthermore, by using the developing solution, the etching back process for removing a portion of the developable material layer 240 can be done with the development tool, instead of being transferred to another etching tool, which is more time efficient and cost-effective.

Referring to FIG. 2D, the silicon nitride layer 230 that is not covered by the remained developable material layer 240a is removed by etching to form a silicon nitride layer 230a.

Figure 2E:
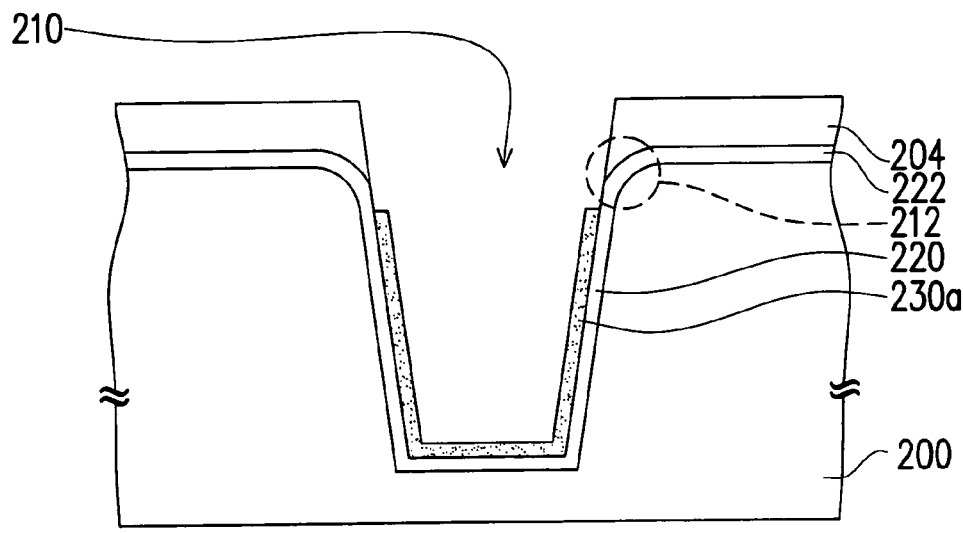

Referring to FIG. 2E, the remained developable material layer 240a is removed by a strip process. Preferably, the strip process is similar to the photoresist strip process. Afterwards, a corner rounding step is conducted by performing a rapid thermal process, so that the exposed top corners 212 of the trenches and/or the exposed substrate surface of the trench 210 are oxidized and an oxide layer 222 consisting of the liner layer 220 and the pad layer 202 is formed. In this corner rounding step, the thermal process not only rounded the top corners of the trench by consuming a small portion of the substrate at the exposed top corners, but also help restore defects of the liner layer 220 or around the edges of the trench. The conditions of the rapid thermal process can be adjusted according to the layout design, the pitch width and the aspect ratios of the trenches.

After corner rounding, the thickness of the oxide layer 222 is more uniform, especially at the corners 212 of the trench 210 for better insulation, thus avoiding current leakage.

Figure 2F:
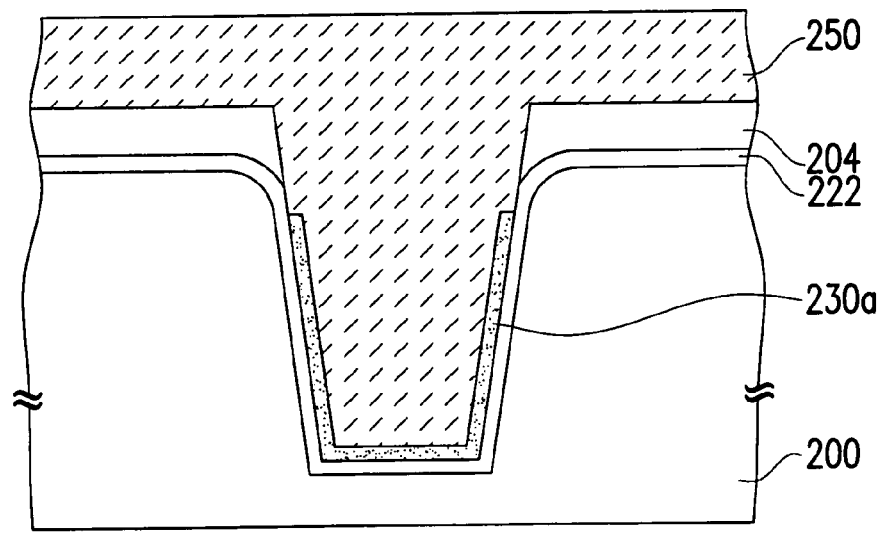

Referring to FIG. 2F, an insulating layer 250 is deposited over the substrate 200 and the remained silicon nitride layer 230a and fills up the trench 210. The insulating layer 250 is, for example, formed by high density plasma chemical vapor deposition (HDPCVD).

Figure 2G:
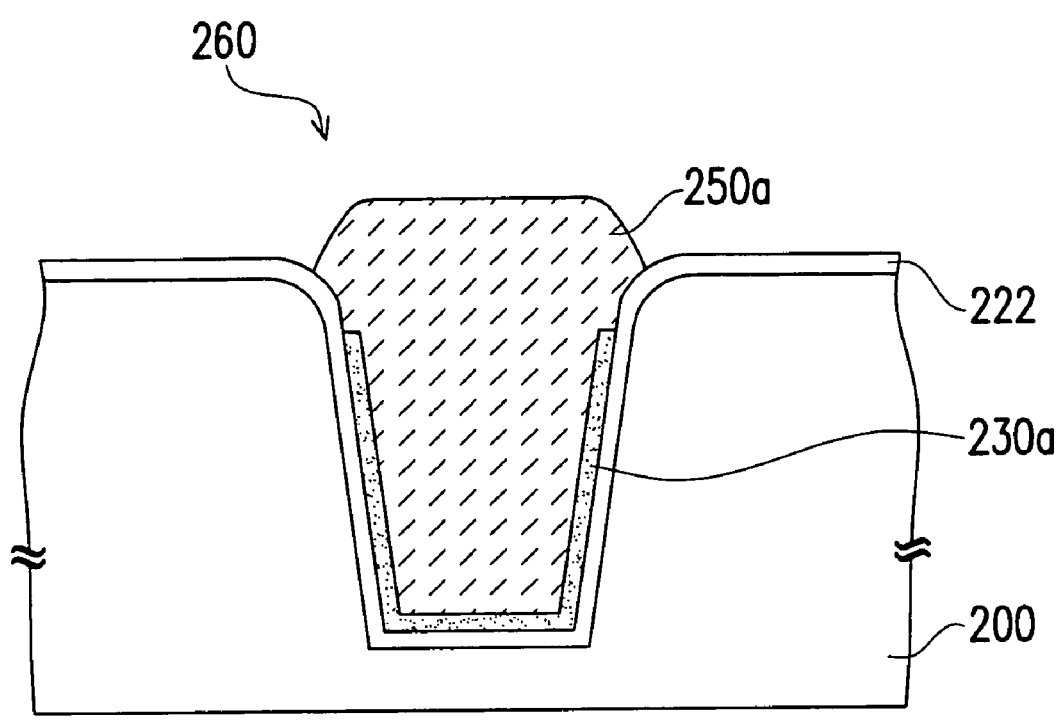

Later, referring to FIG. 2G, chemical mechanical polishing (CMP) is used to planarize the insulating layer 250 using the mask layer 204 as the stop layer. Next, the mask layer 204 is removed and a STI structure 260 is obtained.

The above embodiments are merely feasible examples and will not be used to limit the method of this invention.

In summary, the silicon nitride layer is partially removed to expose the top corners or the periphery of the trench and a thermal process is performed to round the corners for forming a sufficiently thick oxide layer. Moreover, by using the developable material layer to cover the silicon nitride layer to be preserved, the exposed silicon nitride layer around the corners of the trench is removed in a self-aligned way, thus avoiding the prior misalignment issues by using the photolithography process.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for forming a shallow trench isolation structure, comprising:
   providing a substrate with a patterned pad oxide layer and a patterned mask layer thereon;
   patterning the substrate to form at least a trench in the substrate, using the patterned mask layer as a mask;
   forming a liner oxide layer on a surface of the substrate in the trench;
   forming a silicon nitride layer over the substrate, covering the liner oxide layer and the patterned mask layer;
   forming a developable material layer on the silicon nitride layer to fill the trench;
   performing a baking process;
   removing a portion of the developable material layer until a top surface of the remained developable material layer is lower than that of the substrate;
   removing the silicon nitride layer that is exposed by the remained developable material layer, exposing a portion of the substrate;
   removing the remained developable material layer;
   performing a thermal process to oxidize an exposed surface of the substrate;
   forming an insulating layer over the substrate and filling the trench; and
   performing a planarization process to the insulating layer and removing the patterned mask layer to form the shallow trench isolation structure.

2. The method of claim 1, wherein a material of the developable material layer is a negative photoresist material or a developable bottom anti-reflective coating (d-BARC) material.

3. The method of claim 1, wherein a thickness of the developable material layer is between 7500-30000 Angstroms.

4. The method of claim 1, wherein a temperature of the baking process is between 120-240° C.

5. The method of claim 1, wherein the step of removing a portion of the developable material layer includes performing an etching back step.

6. The method of claim 5, wherein a developing solution is used for the etching back step.

7. The method of claim 6, wherein the developing solution includes tetra-methylammonium hydride (TMAH).

8. The method of claim 5, wherein a hard baking process is further performed after the etching back step.

9. The method of claim 1, wherein a material of the patterned mask layer includes silicon nitride.

10. The method of claim 1, wherein a material of the patterned pad layer includes silicon oxide.

11. The method of claim 1, wherein the step of forming the insulating layer includes performing high density plasma chemical vapor deposition to form a silicon oxide layer.

12. A method for forming a shallow trench isolation structure, comprising:
   providing a substrate with at least a trench therein and with a patterned mask layer formed on the substrate around the trench;
   forming a liner layer on a surface of the substrate in the trench;
   forming a silicon nitride layer over the substrate, covering the liner layer and the patterned mask layer;
   forming a developable material layer on the silicon nitride layer to fill the trench;
   removing a portion of the developable material layer until a top surface of the remained developable material layer is lower than that of the substrate;
   removing the silicon nitride layer that is exposed by the remained developable material layer, exposing a portion of the substrate;
   removing the remained developable material layer;
   performing a thermal process;
   forming an insulating layer over the substrate and filling the trench; and
   performing a planarization process to the insulating layer to form the shallow trench isolation structure.

13. The method of claim 12, wherein a material of the developable material layer is a negative photoresist material or a developable bottom anti-reflective coating (d-BARC) material.

14. The method of claim 12, wherein a thickness of the developable material layer is between 7500-30000 Angstroms.

15. The method of claim 12, further comprising a baking process after forming the developable material layer.

16. The method of claim 12, wherein the step of removing a portion of the developable material layer includes performing an etching back step.

17. The method of claim 16, wherein a developing solution is used for the etching back step.

* * * * *